US007728625B1

(12) United States Patent
Nechamkin et al.

(10) Patent No.: US 7,728,625 B1
(45) Date of Patent: Jun. 1, 2010

(54) SERIAL INTERFACE FOR PROGRAMMABLE LOGIC DEVICES

(75) Inventors: Kenneth Nechamkin, Flanders, NJ (US); Jonathan E. Rook, Horsham, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 279 days.

(21) Appl. No.: 12/001,600

(22) Filed: Dec. 11, 2007

(51) Int. Cl.
    *H01L 25/00* (2006.01)
(52) U.S. Cl. .............................. 326/41; 326/47; 326/62; 710/71
(58) Field of Classification Search ............. 326/37–41, 326/47
    See application file for complete search history.

(56) References Cited

U.S. PATENT DOCUMENTS

| 7,602,212 | B1 * | 10/2009 | Chan et al. ..................... 326/37 |
| 2004/0032282 | A1 * | 2/2004 | Lee et al. ....................... 326/39 |
| 2008/0013609 | A1 * | 1/2008 | Daxer et al. .................. 375/221 |

OTHER PUBLICATIONS

Xilinx, Aurora Protocol Specification, SP002 (v1.3), Jun. 21, 2004, 108 pages.
Altera Corp. and Innocor Ltd., SerialLite Protocol Specification, Revision 1.0, Nov. 2003, 78 pages.

* cited by examiner

*Primary Examiner*—Vibol Tan
*Assistant Examiner*—Jany Tran
(74) *Attorney, Agent, or Firm*—Haynes and Boone, LLP

(57) ABSTRACT

Various serial interface implementations and related methods are provided for establishing serial data links with programmable logic devices (PLDs). In one example, a PLD includes a plurality of programmable logic blocks adapted to be programmed to configure the PLD for its intended function. The PLD also includes a serial interface comprising a transmit port, a microcontroller, a transmit register, and transmit logic. The microcontroller is adapted to adjust pre-emphasis settings associated with the transmit port to tune a serial data link between the PLD and an external device. The transmit register is adapted to receive a data signal from the programmable logic blocks. The data signal comprises transmit data to be provided over the serial data link through the transmit port. The transmit logic is adapted to prepare a serial signal for transmission from the transmit port over the serial data link. The serial signal comprises the transmit data.

18 Claims, 8 Drawing Sheets

SERIAL INTERFACE FOR PROGRAMMABLE LOGIC DEVICES

TECHNICAL FIELD

The present invention relates generally to data interfaces and, more particularly, to data interfaces for programmable logic devices.

BACKGROUND

Data transfers between electronic devices have conventionally been performed with parallel data buses. When a need for greater bandwidth arises in such implementations, developers are generally forced to widen parallel data buses, increase clock frequencies, or both. Unfortunately, as bus sizes and clock frequencies increase, additional design factors such as the control of printed circuit board trace characteristics, connector sizes, and skew between data and clocks all become more difficult to manage.

As an alternative to parallel data transfers, serial buses may be used to perform serial data transfers. In particular, developers may incorporate serializer-deserializer (serdes) devices with clock and data recovery (CDR) facilities into their products to convert data into serial format for transfer over serial busses. Various existing serdes devices are designed for use with devices compliant with standard interfaces such as the 10 gigabit attachment unit interface (XAUI), gigabit ethernet (GbE), or peripheral component interconnect express (PCIe). As a result, developers are generally forced to provide support for one or more such interface standards in their products in order to incorporate existing serdes devices.

Unfortunately, existing serdes approaches can unduly burden developers. For example, many serdes-compatible industry standards require developers to have knowledge of various complicated interface protocols (e.g., XAUI, GbE, or PCIe) in order to properly implement the standards. The incorporation of such standards by developers can also be costly in terms of overhead (e.g., loss of bandwidth) and additional components that must be incorporated into the developer's product to support such standards. This approach is particularly inefficient in applications where a designer seeks to implement a point-to-point connection to transfer data from chip to chip or board to board within a system, and does not need more sophisticated interfacing that may be supported by such industry standards.

Accordingly, there is a need for an alternative approach to serial interfacing that permits developers to conveniently add serial data transfer capabilities to products without requiring developers to implement support for complicated interface protocols. Similarly, there is a need for such an approach without incurring extensive overhead associated with prior approaches.

SUMMARY

In accordance with one embodiment of the present invention, a programmable logic device (PLD) includes a plurality of programmable logic blocks adapted to be programmed to configure the PLD for its intended function; and a serial interface comprising: a transmit port, a microcontroller adapted to adjust pre-emphasis settings associated with the transmit port to tune a serial data link between the PLD and an external device, a transmit register adapted to receive a data signal from the programmable logic blocks, wherein the data signal comprises transmit data to be provided over the serial data link through the transmit port, and transmit logic adapted to prepare a serial signal for transmission from the transmit port over the serial data link, wherein the serial signal comprises the transmit data.

In accordance with another embodiment of the present invention, a method performed by a serial interface of a programmable logic device (PLD) to provide a serial data link between the PLD and an external device includes adjusting pre-emphasis settings associated with a transmit port of the PLD to tune the serial data link; receiving a data signal from programmable logic blocks of the PLD, wherein the data signal comprises transmit data to be provided over the serial data link through the transmit port; and preparing a serial signal for transmission from the transmit port over the serial data link, wherein the serial signal comprises the transmit data.

In accordance with another embodiment of the present invention, a programmable logic device (PLD) includes means for configuring the PLD for its intended function; means for transmitting a serial signal; means for adjusting pre-emphasis settings associated with the transmitting means to tune a serial data link between the PLD and an external device; means for receiving a data signal from the configuring means, wherein the data signal comprises transmit data to be provided over the serial data link through the transmitting means; and means for preparing the serial signal for transmission from the transmitting means over the serial data link, wherein the serial signal comprises the transmit data.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

In various embodiments set forth herein, serial interfaces may be used by developers to conveniently implement serial data links with PLDs without requiring developers to have extensive knowledge of the particular implementation details of the protocols used by the serial interfaces. For example, in one embodiment, developers may program programmable logic blocks of a PLD to provide data to, or receive data from, one or more registers of a serial interface of the PLD. Advantageously, the handling of such data by the serial interface to provide a serial data link for transmission or reception of the data in relation to other devices may be transparent to the programmable logic blocks of the PLD.

Figure 1:
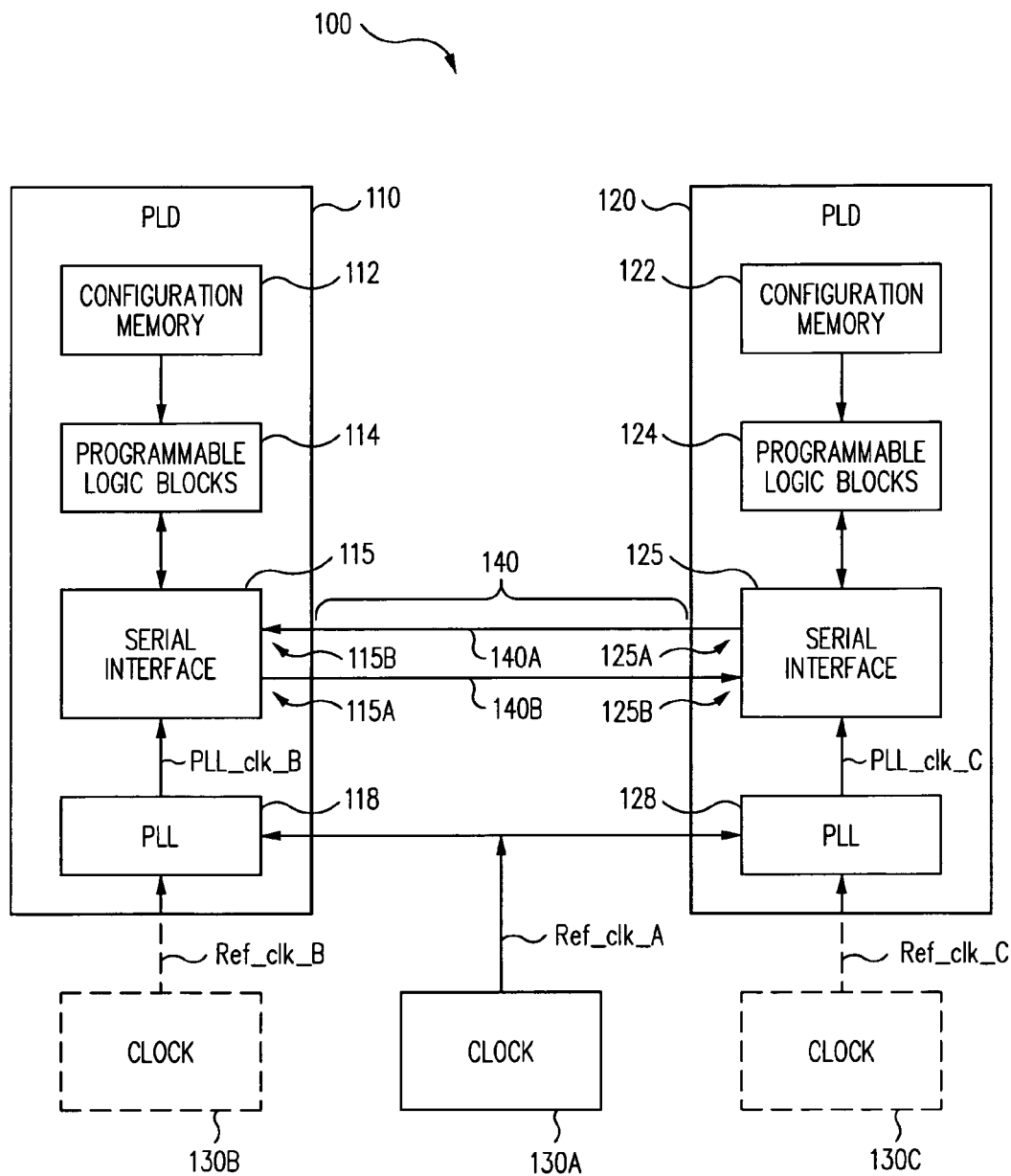
FIG. 1 illustrates a plurality of PLDs in communication over a serial data link in accordance with an embodiment of the invention.

Referring now to the drawings wherein the showings are for purposes of illustrating preferred embodiments of the present invention only, and not for purposes of limiting the same, FIG. 1 illustrates a plurality of PLDs 110 and 120 (e.g., field-programmable gate arrays (FPGAs)) in communication over a serial data link 140 in accordance with an embodiment of the invention. As shown, PLDs 110/120 include serial interfaces 115/125 with corresponding transmit ports 115A/125A, and receive ports 115B/125B, respectively, which may be used for serial data communication between PLDs 110 and 120 over transmit and receive paths 140A and 140B of serial data link 140. Accordingly, means such as transmit ports 115A and 125A may be used for transmitting serial signals over serial data link 140, and means such as receive ports 115B and 125B may be used for receiving serial signals over serial data link 140.

Serial interfaces 115 and 125 may be used to implement serial data link 140 in accordance with a serial protocol supporting normal and high priority data encoding, as well as packet-based and streaming-based data transmissions. The serial protocol may also be implemented to support user-defined control characters as may be desired in particular embodiments to support various user-defined operations such as, for example, data flow control, data packet retransmission, CRC checking, or other operations. Additional protocol-specific characters may be used to support initialization of serial data link 140, indicate when no data is being sent (e.g., idle characters), and define start and end points of physical layer data packets. Serial interfaces 115 and 125 may also be implemented to support synchronization and tuning of serial data link 140 as further described herein. In various embodiments, serial interfaces 115 and 125 may be implemented with dedicated hardware, programmable logic, or combinations of both.

PLDs 110 and 120 include programmable logic blocks 114 and 124 (e.g., also referred to in the art as configurable logic blocks or logic array blocks) to provide logic functionality for PLDs 110 and 120, such as, for example, LUT-based logic typically associated with FPGAs. The configuration of programmable logic blocks 114 and 124 is determined by configuration data stored in configuration memory 112 and 122 (e.g., block SRAM), respectively. Means such as programmable logic blocks 114 and/or 124 may be used for programming PLDs 110 and 120 for their intended functions.

In one embodiment, programmable logic blocks 114 and 124 may provide serial interfaces 115 and 125 with data packets delineated by control characters that define the start and end of each data packet. In another embodiment, programmable logic blocks 114 and 124 may provide serial interfaces 115 and 125 with streaming data that is broken up into individual data packets by serial interfaces 115 and 125 for transmission.

Advantageously, the use of packet-based communication between serial interfaces 115 and 125 permits individual data packets to be stamped with a sequence order and facilitates detection of missed packets, which can be retransmitted. Error checking may also be implemented by applying appropriate cyclic redundancy check (CRC) techniques to the data packets.

PLDs 110 and 120 also include phase-locked loop (PLL) blocks 118 and 128, respectively, which may receive a common reference clock signal (labeled "Ref_clk_A") from a clock source 130A. In one embodiment, clock source 130A may provide a reference clock signal of approximately 77.125 MHz, 156.5 MHz, or 312.5 MHz. For these values, PLLs 118 and 128 may multiply the reference clock signal by factors of 4, 2, or 1, respectively, to provide PLL clocks (labeled "PLL_clk_B" and "PLL_clk_C") to serial interfaces 115 and 125 of approximately 312.5 MHz. The PLL clocks may be further multiplied by a factor of 10 within serial interfaces 115 and 125 to support a serial bitrate of approximately 3.125 Gbps over serial data link 140.

Optionally, PLL blocks 118 and 128 may receive separate reference clock signals (labeled "Ref_clk_B" and "Ref_clk_C") from separate clock sources 130B and 130C (illustrated with broken lines in FIG. 1), respectively. Serial interfaces 115 and 125 may be implemented to insert idle data characters in data traffic provided over serial data link 140 to compensate for differences in clock frequencies of the separate reference clock signals.

Figure 2:
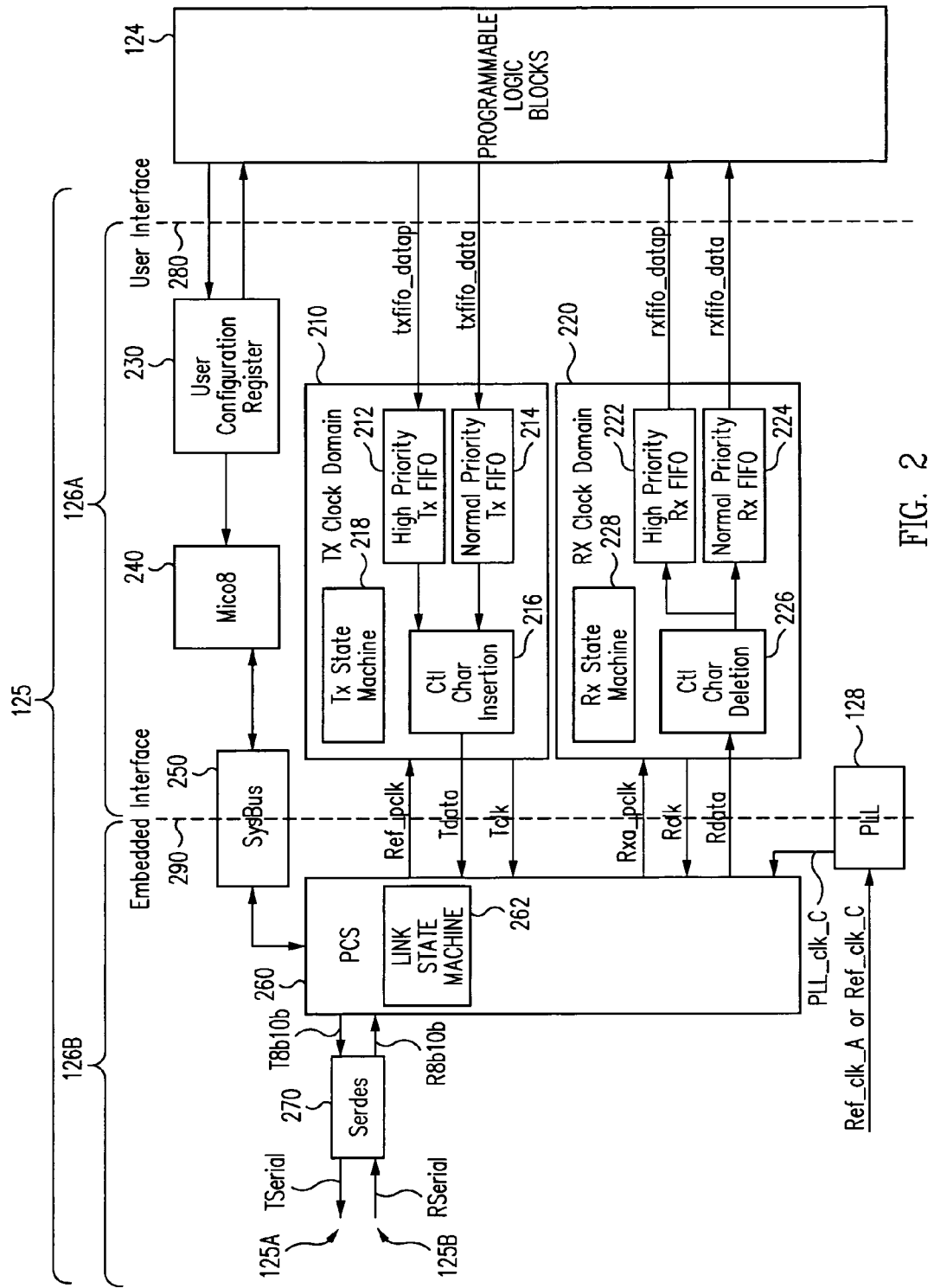
FIG. 2 illustrates components of a serial interface of a PLD in accordance with an embodiment of the invention.

FIG. 2 illustrates components of serial interface 125 of PLD 120 in accordance with an embodiment of the invention. It will be appreciated that the description of serial interface 125 provided herein may be similarly applied to serial interface 115 of PLD 110. Serial interface 125 includes a programmed portion 126A which may be implemented, for example, by additional programmable logic blocks of PLD 120. Serial interface 125 also includes a hardware portion 126B which may be implemented, for example, by one or more dedicated circuits such as an application-specific integrated circuit (ASIC). Programmed portion 126A and hardware portion 126B may communicate through the exchange of various signals across an embedded interface 290 that denotes which portions of serial interface 125 reside in programmed portion 126A and/or dedicated hardware portion 126B.

Programmed portion 126A includes a transmit block 210 (labeled "TX Clock Domain"), a receive block 220 (labeled "RX Clock Domain"), a user configuration register 230, a microcontroller 240 (labeled "Mico8"), and a system bus 250 (labeled "SysBus"). Hardware portion 126B includes a physical control sublayer (PCS) block 260, and a serdes block 270. As shown, PCS block 260 receives a reference clock from PLL block 128. As also shown, portions of system bus 250 and PLL block 128 may be implemented in programmed portion 126A and hardware portion 126B. Serial interface 125 and programmable logic blocks 124 may communicate through various signals passing through a user interface 280 that denotes the interface between programmed portion 126A of serial interface 125, and programmable logic blocks 124 residing outside of serial interface 125.

As shown in FIG. 2, programmable logic blocks 124 may provide transmit block 210 with a high priority transmit data signal (labeled "txfifo_datap") and a normal priority transmit data signal (labeled "txfifo_data") corresponding to high priority and normal priority data, respectively, to be transmitted by serial interface 125 over serial data link 140 as part of a serial signal (labeled "TSerial"). Signals txfifo_datap and txfifo_data are received by a high priority transmit first-in-first-out (FIFO) register 212 and a normal priority transmit FIFO register 214, respectively, of transmit block 210. In this regard, means such as high priority transmit FIFO register 212 and normal priority transmit FIFO register 214 may be used for receiving data signals from programmable logic blocks 124.

Portions of serial interface 125 between transmit FIFO registers 212/214 and transmit port 125A provide transmit logic that is used to prepare serial signal TSerial. In this regard, means such as PCS block 260 and serdes block 270 may be used for preparing serial signal TSerial for transmission from transmit port 125A over serial data link 140.

Transmit block 210 also includes control character insertion logic 216 and a transmit state machine 218. Transmit state machine 218 controls the flow of data through transmit FIFO registers 212 and 214 and control character insertion logic 216. In one embodiment, transmit state machine 218 may process high priority data stored by high priority transmit FIFO register 212 prior to processing normal priority data stored by normal priority FIFO register 214. As a result, normal priority data passing through serial interface 125 (e.g., passing from programmable logic blocks 124 to transmit port 125A) may be interrupted by high priority data. In this regard, the high priority data may be inserted (e.g., as one or more serial data packets corresponding to the high priority data) in serial signal TSerial prior to the normal priority data (e.g., which may be subsequently inserted as one or more serial data packets corresponding to the normal priority data).

Transmit state machine 218 examines data read from transmit FIFO registers 212 and 214 in order to instruct control character insertion logic 216 to substitute translated user control characters (further described herein) for any user control characters (also further described herein) included in the data. The data (including any translated user control characters) is passed to PCS block 260 through a signal Tdata. Transmit block 210 may provide signal Tdata in 16 bit (e.g., 2 byte) segments to PCS block 260 under the synchronization of a receive clock (labeled "Ref_pclk") received from PCS block 260. Receive clock Ref_pclk is used by transmit block 210 to synchronize all data movement and control activity internal to transmit block 210. Receive clock Ref_pclk is also used as a transmit clock (labeled "Tclk") to synchronously transferring data from transmit block 210 to PCS block 260.

Additional signals may be exchanged between programmable logic blocks 124 and transmit block 210 in addition to those illustrated in FIG. 2 as identified in the following Table 1:

TABLE 1

| Signal | Width | Direction | Description |
|---|---|---|---|
| txfifo_clk | 1 | 124 to 210 | Clock supplied by user to write data to normal priority transmit FIFO register |
| txfifo_we | 1 | 124 to 210 | Enable supplied by user to write data to normal priority transmit FIFO register |
| txfifo_data | 16 | 124 to 210 | Data in 2 bytes (txfifo_data[7:0] and txfifo_data[15:8]) supplied by user (0 = lsb); this data is written to normal priority transmit FIFO register |
| txfifo_ctl0 | 1 | 124 to 210 | Logic 1 = control; logic 0 = data for byte txfifo_data[7:0] |
| txfifo_ctl1 | 1 | 124 to 210 | Logic 1 = control; logic 0 = data for byte txfifo_data[15:8] |
| txfifo_aempty | 1 | 210 to 124 | Almost empty flag from normal priority transmit FIFO register |
| txfifo_empty | 1 | 210 to 124 | Empty flag from normal priority transmit FIFO register |
| txfifo_afull | 1 | 210 to 124 | Almost full flag from normal priority transmit FIFO register |

TABLE 1-continued

| Signal | Width | Direction | Description |
|---|---|---|---|
| txfifo_full | 1 | 210 to 124 | Full flag from normal priority transmit FIFO register |
| txfifo_clkp | 1 | 124 to 210 | Clock supplied by user to write data to high priority transmit FIFO register |
| txfifo_wep | 1 | 124 to 210 | Enable supplied by user to write data to high priority transmit FIFO register |
| txfifo_datap | 16 | 124 to 210 | Data in 2 bytes (txfifo_datap[7:0] and txfifo_datap[15:8]) supplied by user (0 = lsb); this data is written to high priority transmit FIFO register |
| txfifo_ctl0p | 1 | 124 to 210 | Logic 1 = control; logic 0 = data for byte txfifo_datap[7:0] |
| txfifo_ctl1p | 1 | 124 to 210 | Logic 1 = control; logic 0 = data for byte txfifo_datap[15:8] |
| txfifo_aemptyp | 1 | 210 to 124 | Almost empty flag from high priority transmit FIFO register |
| txfifo_emptyp | 1 | 210 to 124 | Empty flag from high priority transmit FIFO register |
| txfifo_afullp | 1 | 210 to 124 | Almost full flag from high priority transmit FIFO register |
| txfifo_fullp | 1 | 210 to 124 | Full flag from high priority transmit FIFO register |

PCS block 260 encodes the data received from transmit block 210 in 8b10b format as an 8b10b encoded data packet and provides the 8b10b encoded data packet to serdes block 270 through signal T8b10b. It will be appreciated that the use of 8b10b encoding for signal T8b10b (and also for signal R8b10b further described herein) permits a neutral DC bias (e.g., an approximately equal number of ones and zeros) to be maintained and can provide sufficient numbers of transitions to permit appropriate CDR operations to be performed. Serdes block 270 converts the 8b10b encoded data packet received from PCS block 260 into a serial data packet for transmission over transmit port 125A as part of serial signal TSerial.

Means such as microcontroller 240 may be used for adjusting pre-emphasis settings associated with transmit port 125A to tune serial data link 140 to facilitate the establishment of serial data link 140. In this regard, serial signal TSerial may be boosted to counter the effects of signal attenuation as serial signal TSerial propagates over transmit path 140A. For example, in one embodiment microcontroller 240 may be implemented to control the boosting of serial signal TSerial by various amounts in order to establish serial data link 140 as further described herein.

As shown in FIG. 2, receive block 220 may provide programmable logic blocks 124 with a high priority receive data signal (labeled "rxfifo_datap") and a normal priority receive data signal (labeled "rxfifo_data") corresponding to high priority and normal priority data, respectively, received by serial interface 125 over serial data link 140. The rxfifo_datap and rxfifo_data signals are provided by a high priority receive FIFO register 222 and a normal priority receive FIFO register 224, respectively, of receive block 220. In this regard, means such as high priority receive FIFO register 222 and normal priority receive FIFO register 224 may be used for providing data signals to programmable logic blocks 124.

Receive port 125B receives a serial signal (labeled "RSerial") from serial data link 140 through receive port 125B. The received serial signal may include a serial data packet comprising data to be provided to programmed logic blocks 124.

Portions of serial interface 125 between receive registers 222/224 and receive port 125B provide receive logic that is used to extract this data from serial signal RSerial. In this regard, means such as PCS block 260 and serdes block 270 may be used for extracting data from serial signal RSerial. The extracted data may be provided to programmable logic blocks 124 from receive registers 222 and 224 through signals rxfifo_datap and rxfifo_data, respectively.

Means such as microcontroller 240 may be used for adjusting equalization settings associated with receive port 125B to tune serial data link 140 to facilitate the establishment of serial data link 140. In this regard, serial signal RSerial may be boosted to aid serial interface 125 in determining voltage transitions of serial signal RSerial which may become obscured by distortion introduced into serial signal RSerial during its propagation over receive path 140B. For example, in one embodiment microcontroller 240 may be implemented to control the boosting of serial signal RSerial by various amounts in order to establish serial data link 140 as further described herein.

As shown in FIG. 2, serial signal RSerial is provided to serdes block 270. Serdes block 270 deserializes a received serial data packet included in serial signal RSerial to provide an 8b10b encoded data packet to PCS block 260 through signal R8b10b. PCS block 260 decodes the received 8b10b encoded data packet to provide data from the 8b10b encoded data packet to transmit block 220 through a signal Rdata. PCS block 260 includes a link state machine (LSM) 262 which may be configured to synchronize the receive path of serial interface 125 with serial interface 115 of PLD 110.

PCS block 260 also provides to receive block 220 a recovered reference clock (labeled "Rxa_pclk") that is derived from the received serial signal. Reference clock Rxa_pclk is used by receive block 220 to synchronize all data movement and control activity internal to receive block 220. Reference clock Rxa_pclk is also used as a receive clock (labeled "Rclk") to synchronize data transfer between PCS block 260 and receive block 220.

Receive block 220 includes control character deletion logic 226 and a receive state machine 228. Receive state machine 228 controls the flow of data through control character deletion logic 226 and into receive FIFO registers 222 and 224. Specifically, receive state machine 228 examines signal Rdata received from PCS block 260 in order to instruct control character deletion logic 226 to remove any characters added by the far end serial interface (e.g., serial interface 115 of PLD 110 in this embodiment) and pass the data to receive FIFO registers 222 and/or 224. Receive block 220 passes data stored by receive FIFO registers 222 and/or 224 to programmable logic blocks 124 as high and low priority receive data signals rxfifo_datap and rxfifo_data, respectively.

Additional signals may be exchanged between programmable logic blocks 124 and receive block 220 in addition to those illustrated in FIG. 2 as identified in the following Table 2:

TABLE 2

| Signal | Width | Direction | Description |
|---|---|---|---|
| rxfifo_clk | 1 | 124 to 220 | Clock supplied by user to read data from normal priority receive FIFO register |
| rxfifo_re | 1 | 124 to 220 | Enable supplied by user to read data from normal priority receive FIFO register |
| rxfifo_data | 16 | 220 to 124 | Normal priority data in 2 bytes (rxfifo_data[7:0] and rxfifo_data[15:8]) supplied to user (0 = lsb) from receive logic |
| rxfifo_ctl0 | 1 | 220 to 124 | Logic 1 = control; logic 0 = data for byte rxfifo_data[7:0] |
| rxfifo_ctl1 | 1 | 220 to 124 | Logic 1 = control; logic 0 = data for byte rxfifo_data[15:8] |
| rxfifo_aempty | 1 | 220 to 124 | Almost empty flag from normal priority receive FIFO register |
| rxfifo_empty | 1 | 220 to 124 | Empty flag from normal priority receive FIFO register |
| rxfifo_afull | 1 | 220 to 124 | Almost full flag from normal priority receive FIFO register |
| rxfifo_full | 1 | 220 to 124 | Full flag from normal priority receive FIFO register |
| rxfifo_clkp | 1 | 124 to 220 | Clock supplied by user to read data from high priority receive FIFO register |
| rxfifo_rep | 1 | 124 to 220 | Enable supplied by user to read data from high priority receive FIFO register |
| rxfifo_datap | 16 | 220 to 124 | High priority data in 2 bytes (rxfifo_datap[7:0] and rxfifo_datap[15:8]) supplied to user (0 = lsb) from receive logic |
| rxfifo_ctl0p | 1 | 220 to 124 | Logic 1 = control; logic 0 = data for byte rxfifo_datap[7:0] |
| rxfifo_ctl1p | 1 | 220 to 124 | Logic 1 = control; logic 0 = data for byte rxfifo_datap[15:8] |
| rxfifo_aemptyp | 1 | 220 to 124 | Almost empty flag from high priority receive FIFO register |
| rxfifo_emptyp | 1 | 220 to 124 | Empty flag from high priority receive FIFO register |
| rxfifo_afullp | 1 | 220 to 124 | Almost full flag from high priority receive FIFO register |
| rxfifo_fullp | 1 | 220 to 124 | Full flag from high priority receive FIFO register |

User configuration register 230 stores user settings provided by programmable logic blocks 124 to configure the operation of serial interface 125. For example, in one embodiment, user configuration register 230 may be implemented as an eight bit register with individual bits that may be set or reset by programmable logic blocks 124 corresponding to the following Table 3:

TABLE 3

| Bit | Description |
|---|---|
| 7 | Link_ok: read only bit that indicates that serial link has been established |
| 6 | EQ −: decrement input equalization setting when overriding link tuning |
| 5 | EQ +: increment input equalization setting when overriding link tuning |
| 4 | Link tuning: enable automatic tuning of pre-emphasis and input equalization values for proper operation |
| 3 | PE −: decrement pre-emphasis setting when overriding link tuning |
| 2 | PE +: increment pre-emphasis setting when overriding link tuning |
| 1 | Uni Tx: enable only receive direction data traffic and power down portion of serdes block 270 used for transmitted data traffic |
| 0 | Uni Rx: enable only transmit direction data traffic and power down portion of serdes block 270 used for received data traffic |

Table 4 below identifies various signals that may be exchanged between programmable logic blocks 124 and user configuration register 230:

TABLE 4

| Signal | Width | Direction | Description |
|--------|-------|-----------|-------------|
| clk | 1 | 124 to 230 | Clock to write data to the user configuration register |
| enable | 1 | 124 to 230 | Enable writes to the user configuration register |
| wdata | 8 | 124 to 230 | The data written to the user configuration register |
| rdata | 8 | 230 to 124 | The data read from the user configuration register |

Microcontroller 240 communicates with PCS block 260 through system bus 250 to control the establishing of serial data link 140. Programmable logic blocks 124 may optionally adjust the operation of microcontroller 240 by setting various bits of user configuration register 230 as described above.

Serial interface 125 may also be implemented to support user control characters that may be written into transmit FIFO registers 212 and 214 as part of data provided by programmable logic blocks 124, as well as user control characters that may be written into receive FIFO registers 222 and 224 as part of data received over serial data link 140 to be provided to programmable logic blocks 124. The following Table 5 identifies several examples of user control characters:

TABLE 5

| User Control Character | /c.octet/ |
|------------------------|-----------|
| SOPu | /1.00/ |
| EOPu | /1.01/ |
| USER1 | /1.02/ |
| USER2 | /1.03/ |

As shown in Table 5, four different user control characters may be used. In particular, a start of packet ("SOPu") control character may be used to designate the beginning of a data packet defined by programmable logic blocks 124. An end of packet ("EOPu") control character may be used to designate the end of such a data packet. Additional control characters ("USER1" and "USER2") may be used to embed user-defined control characters as may be desired by users in particular implementations.

As also shown in Table 5, each of the user control characters may be represented by two parameters specified in the last column (labeled "/c.octet/"). In this regard, each user control character may be represented by a control bit ("c") and a corresponding hexadecimal number ("octet"). Control bit c in Table 5 represents signals txfifo_ctl0, txfifo_ctl1, txfifo_ctl0p, and txfifo_ctl1p of Table 1, and signals rxfifo_ctl0, rxfifo_ctl1, rxfifo_ctl0p, and rxfifo_ctl1p of Table 2. A control bit set to a value of "1" indicates that the corresponding octet is a user control character, whereas a control bit set to a value of "0" indicates that the corresponding octet is ordinary data to be transmitted or received over serial data link 140. As shown in Table 5, each of the user control characters is designated as a control character and has a corresponding hexadecimal value.

Each of the user control characters of Table 5 may be translated by control character insertion logic 216 into a corresponding translated user control character to be embedded as part of signal Tdata provided from transmit block 210 to PCS block 260 as shown in the following Table 6:

TABLE 6

| Translated User Control Character | 8b10b Protocol | Bb10b Nomenclature | /c.octet/ |
|-----------------------------------|----------------|--------------------|-----------|
| pSOPu | ||Qrsvd|| | /K23.7/D0.0/D0.0/D0.0 | /1.F7/0.00/0.00/0.00/ |
| pEOPu | ||Qrsvd|| | /K23.7/D1.0/D1.0/D1.0 | /1.F7/0.01/0.01/0.01/ |
| pUSER1 | ||Qrsvd|| | /K23.7/D2.0/D2.0/D2.0 | /1.F7/0.02/0.02/0.02/ |
| pUSER2 | ||Qrsvd|| | /K23.7/D3.0/D3.0/D3.0 | /1.F7/0.03/0.03/0.03/ |

In Table 6, translated control characters pSOPu, pEOPu, pUSER1, and pUSER2 correspond to user control characters SOPu, EOPu, USER1, and USER2, respectively, of Table 5. Each of the translated user control characters of Table 6 may also be translated by control character deletion logic 226 into a corresponding user control character of Table 5 to be embedded as part of rxfifo_datap and rxfifo_data signals provided from receive block 220 to programmable logic blocks 124.

As shown in Table 6, each of the translated user control characters may be provided over serial data link 140 in accordance with an appropriate 8b10b protocol and encoded in accordance with appropriate 8b10b nomenclature corresponding to the IEEE 802.3ae specification as will be understood by those skilled in the art. As also shown in Table 6, each of the translated user control characters may be represented by a control bit and hexadecimal numbers.

PCS block 260 may be implemented to support various physical layer control characters as shown in the following Table 7:

TABLE 7

| Physical Layer Control Character | 8b10b Protocol | 8b10b Nomenclature | /c.octet/ |
|----------------------------------|----------------|--------------------|-----------|
| COMMA | ||K|| | /K28.5/ | /1.BC/ |
| SOPn | ||S|| | /K27.7/D0.0/D0.0/D0.0/ | /1.FB/0.00/0.00/0.00/ |
| SOPh | ||S|| | /K27.7/D1.0/D1.0/D1.0/ | /1.FB/0.01/0.01/0.01/ |
| EOP | ||T|| | /K29.7/K28.5/K28.5/K28.5/ | /1.FD/1.BC/1.BC/1.BC/ |
| IDLE | ||Qrsvd|| | /K28.1/ | /1.3C/ |
| RESYNC | ||Qrsvd|| | /K28.2/ | /1.5C/ |
| REALIGN | ||Q|| | /K28.4/D1.0/D1.0/D1.0/ | /1.9C/0.01/0.01/0.01/ |

As will be appreciated by those skilled in the art, the various physical layer control characters shown in Table 7 may be used in accordance with the IEEE 802.3ae specification to control serial data link 140. As shown in Table 7, each of the physical layer control characters may be provided over serial data link 140 in accordance with an appropriate 8b10b protocol and encoded in accordance with appropriate 8b10b nomenclature corresponding to the IEEE 802.3ae specification as will be understood by those skilled in the art. As also shown in Table 7, each of the translated user control characters may be represented by a control bit and hexadecimal numbers.

As shown in Table 7, two different start-of-packet control characters are supported which may be used to denote the start of a normal priority data packet (e.g., "SOPn") or a high priority data packet (e.g., "SOPh"). In this regard, PCS block 260 may be implemented to use these characters to denote data packets associated with normal FIFO registers 214/224 or high priority FIFO registers 212/222.

Although the embodiment of serial interface 125 illustrated in FIG. 2 has been described as a bi-directional interface providing transmission and reception of high and low priority data over serial data link 140, other embodiments are also contemplated as may be desired for particular applications. For example, in one embodiment, serial interface 125 may be implemented as a unidirectional interface providing only transmission or only reception of data. As previously described above with regard to Table 3, programmable logic blocks 124 may select unidirectional operation by setting appropriate values for bits 0 and 1 of user configuration register 230. In another embodiment, only one of transmit FIFO registers 212/214 and/or only one of receive FIFO registers 222/224 may be provided.

Figure 3:
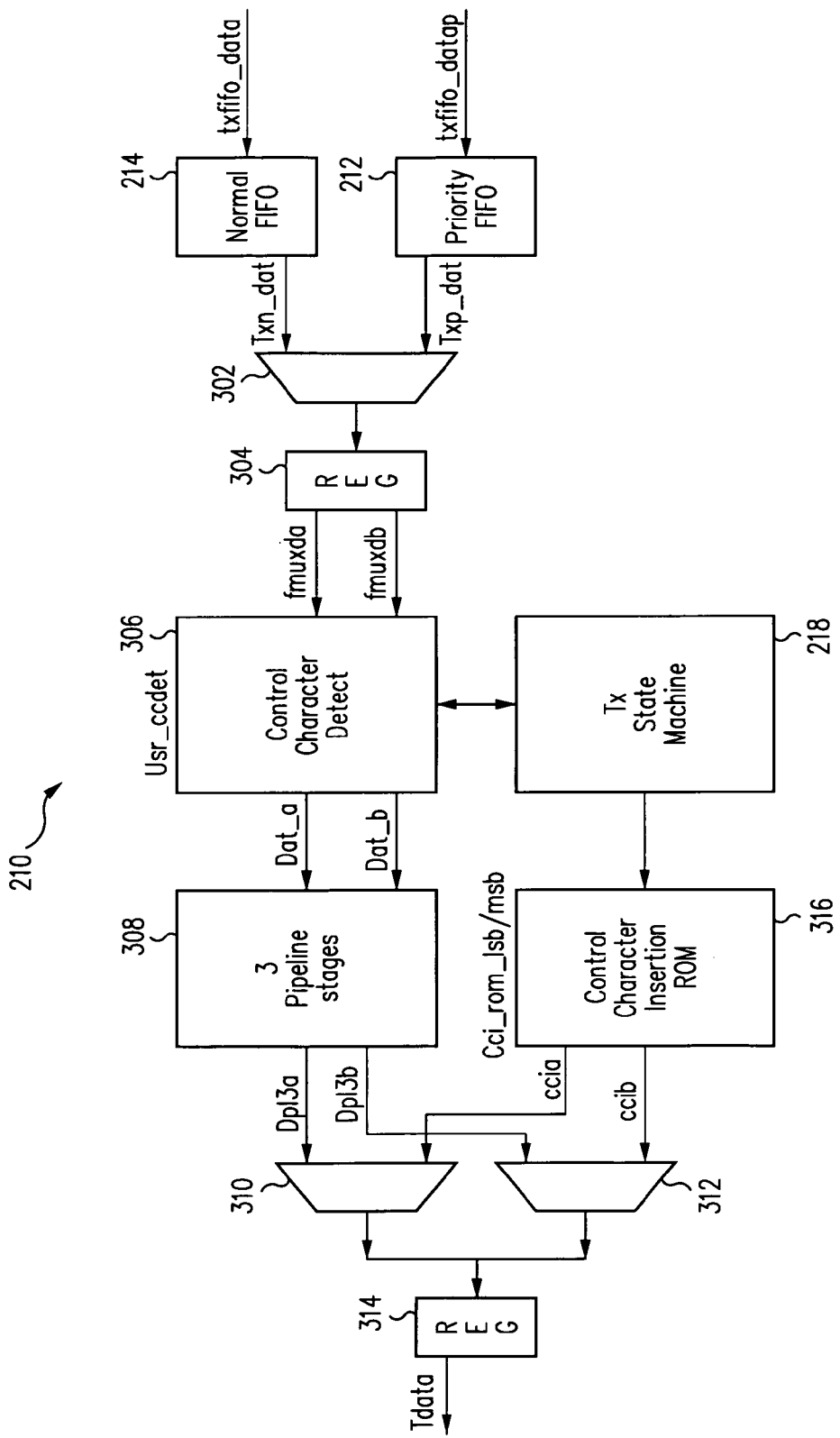
FIG. 3 illustrates a transmit block of a serial interface of a PLD in accordance with an embodiment of the invention.

FIG. 3 illustrates various components of transmit block 210 of serial interface 125 in accordance with an embodiment of the invention. It will be appreciated that the embodiment of transmit block 210 shown in FIG. 3 may also be used to implement a transmit block of serial interface 115.

In particular, FIG. 3 illustrates multiplexers 302, 310, and 312, registers 304 and 314, control character detect logic 306, pipeline stages 308, and a control character insertion ROM 316, all of which may be used to implement control character insertion logic 216 shown in FIG. 2. FIG. 3 further illustrates priority and normal transmit FIFO registers 212 and 214 and transmit state machine 218 previously described in FIG. 2.

As previously described, priority and normal transmit FIFO registers 212 and 214 receive signals txfifo_datap and txfifo_data that include high priority and low priority data, respectively, for transmission over serial data link 140. Data from priority and normal transmit FIFO registers 212 and 214 passes through multiplexer 302. Transmit state machine 218 may control the operation of multiplexer 302 through appropriate control lines (not shown). In this regard, when data is present in high priority transmit FIFO register 212, transmit state machine 218 selects signal Txp_dat. If data is present in normal priority transmit FIFO register 214, and no data is present in high priority transmit FIFO register 212, then transmit state machine 218 selects signal Txn_dat. Data passed by multiplexer 302 is received by register 304 which passes the data on to control character detect logic as signals fmuxda and fmuxdb.

Control character detect logic 306 operates to identify any user control characters (e.g., the user control characters previously discussed in Table 5) in the data provided to control character detect logic 306. If a user control character is detected, transmit state machine 218 may control the substitution of translated user control characters from control character insertion ROM 316 in place of the original user control characters. In this regard, data is passed from control character detect logic 306 to three pipeline stages 308 which may be used to stall the data in pipeline stages to permit translated user control characters to be provided from control character insertion ROM 316 (e.g., as signals "ccia" and "ccib"). Other data (e.g., not user control characters) may be passed through pipeline stages 308 (e.g., as signals "Dp13a" and "Dp13b").

Transmit state machine 218 may control the operation of multiplexers 310 and 312 through appropriate control lines (not shown) to pass the translated user control characters and other data to a register 314 which provides signal Tdata to PCS block 260.

Figure 4:
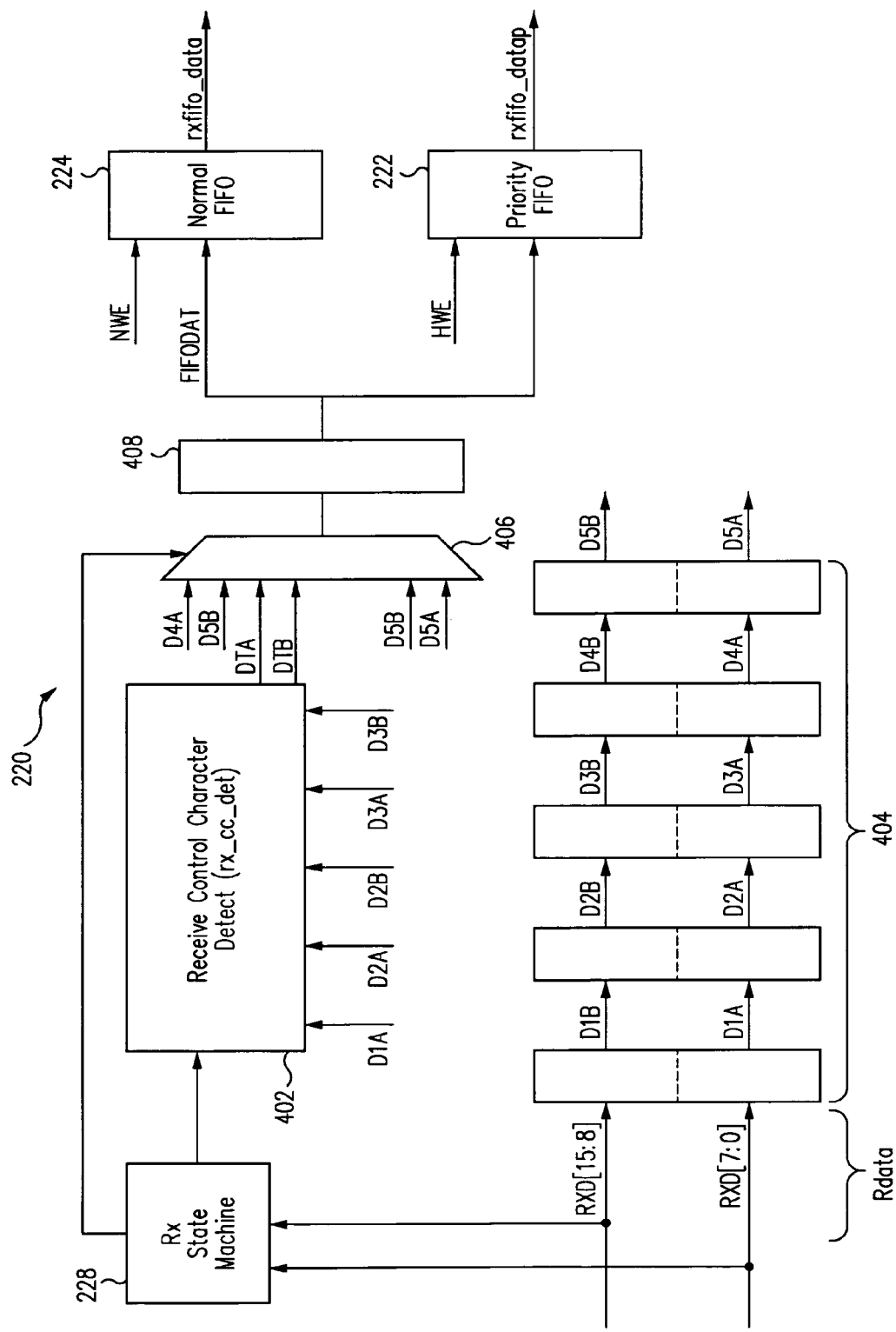
FIG. 4 illustrates a receive block of a serial interface of a PLD in accordance with an embodiment of the invention.

FIG. 4 illustrates various components of receive block 220 of serial interface 125 in accordance with an embodiment of the invention. It will be appreciated that the embodiment of receive block 220 shown in FIG. 4 may also be used to implement a receive block of serial interface 115.

In particular, FIG. 4 illustrates receive control character detect logic 402, five pipeline stages 404, a multiplexer 406, and an additional pipeline stage 408, all of which may be used to implement control character deletion logic 226 shown in FIG. 2. FIG. 4 further illustrates priority and normal receive FIFO registers 222 and 224, and receive state machine 228 previously described in FIG. 2.

Receive state machine 228 and pipeline stages 404 receive data through signal Rdata (illustrated as including data with most significant bits labeled "RXD[15:8]" and least significant bits labeled "RXD[7:0]") from PCS block 260. As shown, data from various portions of pipeline stages 404 are provided to receive control character detect logic 402 and multiplexer 406. Under the control of receive state machine 228, selected data is passed to pipeline stage 408 and written into priority and normal receive FIFO registers 222 and 224 (e.g., as signal "FIFODAT").

Signals DTA and DTB provide a data path from receive control character detect logic 402 to multiplexer 406. Signals DTA and DTB are used to provide the c.octet values of Table 5 corresponding to translated user control characters of Table 6. When a translated user control character of Table 6 is detected by receive control character detect logic 402, receive state machine 228 selects signals DTA and DTB as inputs to multiplexer 406 to pass the corresponding c.octet values of Table 5 to pipeline stage 408 and priority and normal receive FIFO registers 222 and 224. As a result, the translated user control characters of Table 6 are translated back into the original user control characters of Table before being written into one of priority and normal receive FIFO registers 222 and 224. Accordingly, the only control characters passed in signals rxfifo_data and rxfifo_datap will be the user control characters of Table 5.

Receive state machine 228 further provides write enable signals HWE and NWE to priority and normal receive FIFO registers 222 and 224, respectively. When a physical layer control character of Table 7 is detected by receive control character detect logic 402, an appropriate one of write enable signals HWE and NWE is turned off to prevent the writing of the physical layer control character into priority or normal receive FIFO register 222 or 224. When user data or a translated user control character of Table 6 is encountered, one of write enable signals HWE or NWE will be turned on to enable writing of the received data (e.g., user data or a user control character of Table 5 corresponding to the detected translated user control character of Table 6) into the appropriate one of priority and normal receive FIFO registers 222 or 224.

Figure 5A:
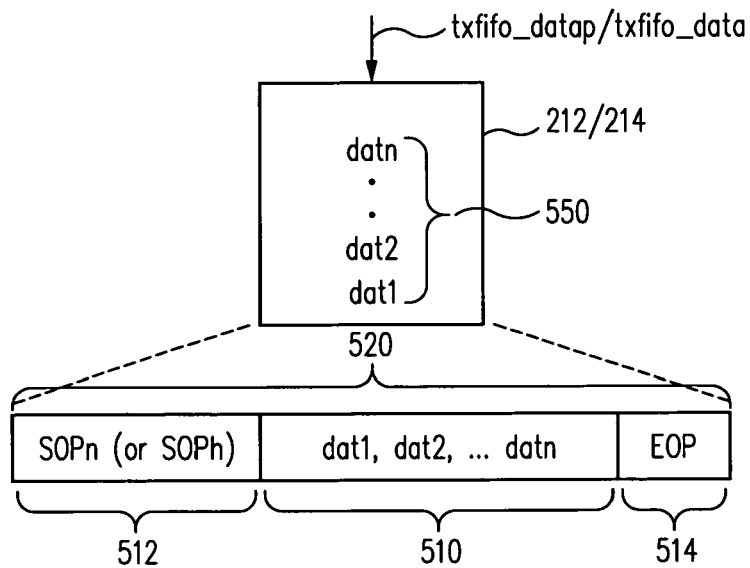
FIGS. 5A-B illustrate processing performed by a serial interface of a PLD on data provided by programmable logic blocks in accordance with embodiments of the invention.

As previously discussed, programmable logic blocks 124 may provide serial interface 125 with streaming data that is broken up into individual data packets by transmit block 210 for transmission by serial interface 125. FIG. 5A illustrates processing performed by transmit block 210 on streamed data provided by programmable logic blocks 124 in accordance with an embodiment of the invention.

As shown in FIG. 5A, one of transmit FIFO registers 212 or 214 receives data 510 (labeled "dat1 to datn") through signal txfifo_datap or signal txfifo_data from programmable logic blocks 124 for transmission over serial data link 140. In the embodiment shown in FIG. 5A, data 510 is streamed into transmit FIFO register 212 or 214 from programmable logic blocks 124. As such, data 510 is not encapsulated by start of packet or end of packet characters of Table 5 while stored by transmit FIFO register 212 or 214.

FIG. 5A also shows data 510 provided by signal Tdata between transmit block 210 and PCS block 260 after having been processed by transmit block 210. As shown, transmit block 210 has appended physical layer control characters SOPn (or SOPh) 512 and EOP 514 to denote the start and end of a data packet 520 including data 510.

The example shown in FIG. 5A may be reversed to process data packets in the receive direction. For example, if data packet 520 is received by receive block 220 from PCS block 260, receive block 220 will remove the appended physical layer control characters SOPn (or SOPh) 512 and EOP 514, and provide receive FIFO registers 222/224 with data 510.

Figure 5B:
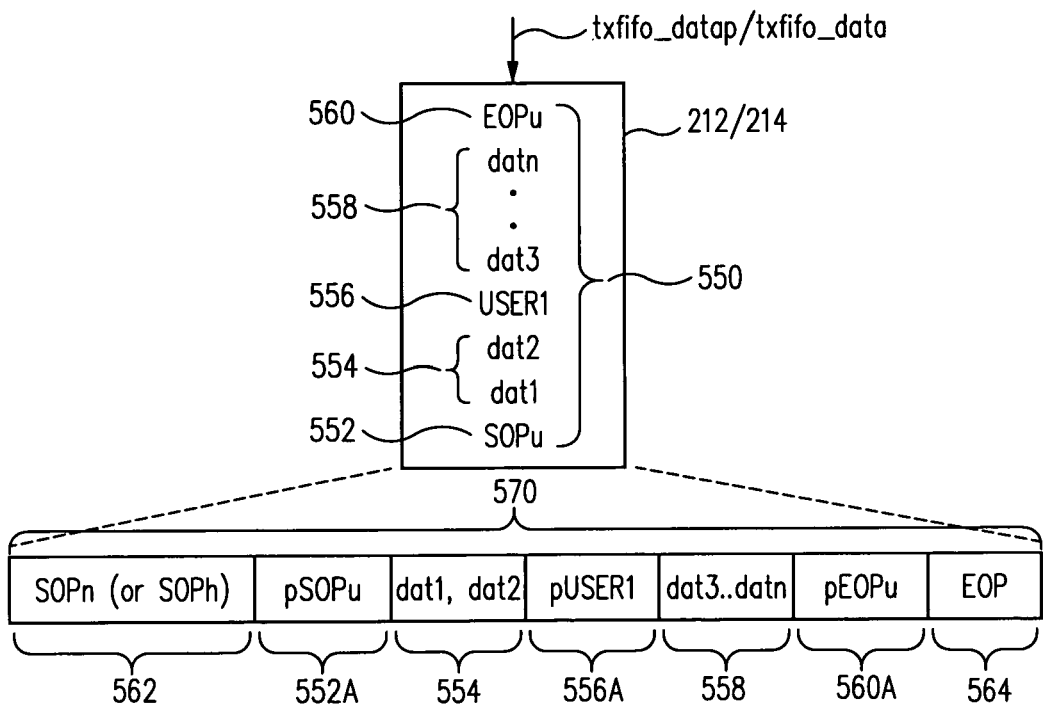

As also previously discussed, programmable logic blocks 124 may provide serial interface 125 with data packets delineated by control characters that define the start and end of each data packet. FIG. 5B illustrates processing performed by transmit block 210 on such data packets provided by programmable logic blocks 124 in accordance with an embodiment of the invention.

As shown in FIG. 5B, one of transmit FIFO registers 212 or 214 receives a data packet 550 received through signal txfifo_datap or txfifo_data from programmable logic blocks 124 for transmission over serial data link 140. The start and end of data packet 550 are defined by user control characters 552 (denoting the start of data packet 550) and 560 (denoting the end of data packet 550). Data packet 550 further includes data 554 (labeled "dat1" and "dat2"), a user control character 556, and additional data 558 (labeled "dat3" to "datn").

FIG. 5B also shows data packet 550 after having been processed by transmit block 210 to provide a data packet 570. In this regard, user control characters 552, 556, and 560 of data packet 550 have been converted by control character insertion logic 216 of transmit block 210 into translated user control characters 552A, 556A, and 560A, respectively. In addition, physical layer control characters SOPn (or SOPh) 562 and EOP 564 have been appended to data packet 570 by transmit block 210.

The example shown in FIG. 5B may also be reversed to process data packets in the receive direction. For example, if data packet 570 is received by receive block 220 from PCS block 260, receive block 220 may remove the appended physical layer control characters SOPn (or SOPh) 562 and EOP 564, and provide receive FIFO registers 222/224 with data 554 and additional data 558. Control character deletion logic 226 of receive block 220 may further convert translated user control characters 552A, 556A, and 560A into user control characters 552, 556, and 560, respectively. As a result, data 554, additional data 558, and user control characters 552, 556, and 560 may be provided to one of receive FIFO registers 222 or 224 as data packet 550 to be further provided to programmable logic blocks 124 through signal rxfifo_datap or rxfifo_data.

Figure 6A:
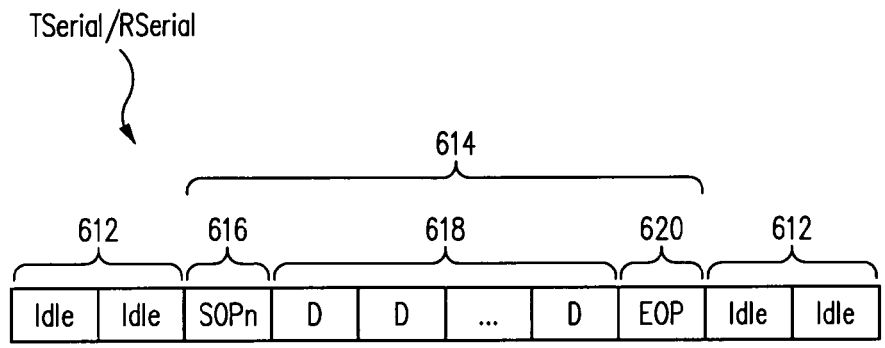
FIGS. 6A-C illustrate serial signals of a serial data link provided by a serial interface of a PLD in accordance with an embodiment of the invention.
Figure 6B:
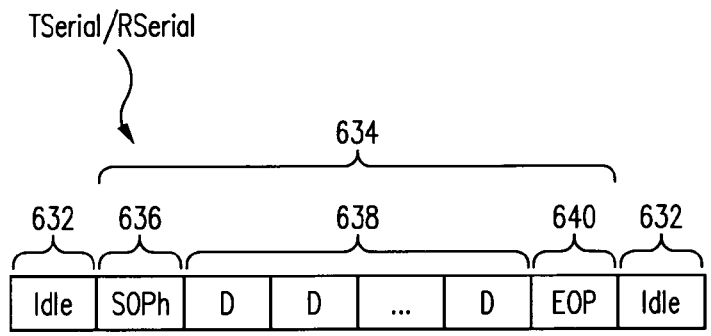
Figure 6C:
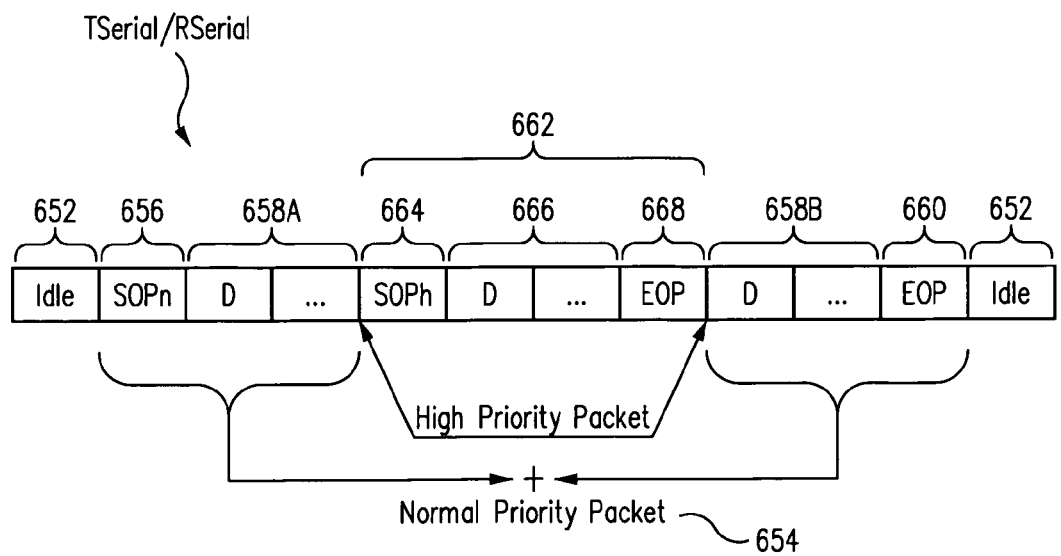

FIGS. 6A-C illustrate various examples of serial signals that may be transmitted or received by serial interface 125 over serial data link 140 (e.g., signals TSerial or RSerial) that include data packets having various priority levels in accordance with embodiments of the invention.

Referring to FIG. 6A, a serial signal is illustrated including a plurality of idle characters 612 and a normal priority serial data packet 614. It will be appreciated that idle characters 612 may be inserted between individual data packets and may be implemented as IDLE physical layer control characters in the manner described in Table 7. As shown, data packet 614 includes a normal priority start-of-packet character 616 (labeled SOPn), an end-of-packet character 620, and data 618.

Referring to FIG. 6B, a serial signal is illustrated including a plurality of idle characters 632 and a high priority serial data packet 634. As similarly described above, idle characters 632 may be implemented as IDLE physical layer control characters in the manner described in Table 7. However, in contrast to FIG. 6A, data packet 634 includes a high priority start-of-packet character 636 (labeled SOPh). Data packet 634 also includes an end-of-packet character 640, and data 638.

Referring to FIG. 6C, a serial signal is illustrated including a plurality of idle characters 652, a normal priority data packet 654, and a high priority data packet 662 nested within normal priority data packet 654. As similarly described above, idle characters 652 may be implemented as IDLE physical layer control characters in the manner described in Table 7. As shown, data packet 654 includes a normal priority start-of-packet character 656 (labeled SOPn), an end-of-packet character 660, data 658A-B, and high priority data packet 662. High priority data packet 662 includes a high priority start-of-packet character 664 (labeled SOPh), an end-of-packet character 668, and data 666.

As previously discussed, microcontroller 240 of serial interface 125 may adjust pre-emphasis settings and equalization settings to facilitate establishing serial data link 140. For example, in one embodiment, four pre-emphasis settings may be used which correspond to boosting serial signal TSerial by various amounts (e.g., identified as 0%, 16%, 33%, and 48%). In another embodiment, three equalization settings may be used which correspond to boosting serial signal RSerial by various amounts (e.g., identified as short, medium, and long). However, it will be appreciated that any pre-emphasis and equalization settings can be used as may be desired in particular applications.

If serial data link 140 has not yet been established, transmit block 210 of serial interface 125 may transmit COMMA and RESYNC characters (identified in Table 7) to a corresponding receive block 220 of serial interface 115. Similarly, a corresponding transmit block 210 of serial interface 115 may transmit such COMMA and RESYNC characters to receive block 220 of serial interface 125. Microcontroller 240 of serial interface 125 may adjust pre-emphasis settings and equalization settings associated with transmit port 125A and receive port 125B, respectively, until characters sent by serial interface 115 are recognized by LSM 262 of serial interface 125. When characters are recognized by LSM 262, LSM 262 sets a sync indicator bit (also referred to as lsm_sync) corresponding to bit 7 of user configuration register 230 of serial interface 125 to indicate that the portion of serial data link 140 between transmit port 115A and receive port 125B has been established. Serial interface 125 may then transmit COMMA and IDLE characters (identified in Table 7) to serial interface 115 to indicate that data is being successfully received by serial interface 125 from serial interface 115. Microcontroller 240 of serial interface 125 may continue to adjust pre-emphasis settings associated with transmit port 125A until COMMA and IDLE characters are received from serial interface 115 to indicate that data is being successfully received by serial interface 115 from serial interface 125.

Figure 7:
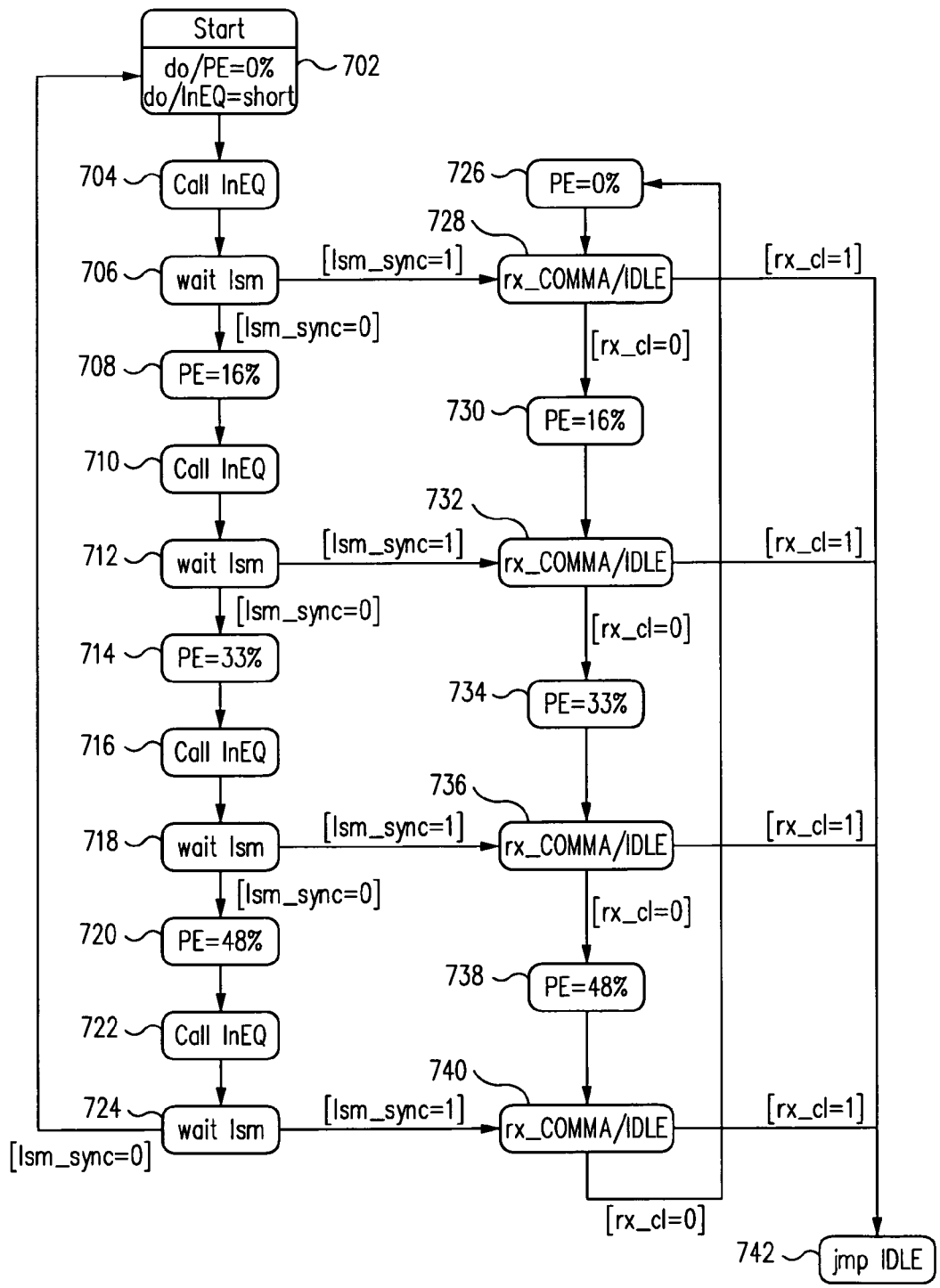
FIG. 7 illustrates a process for establishing a serial data link in accordance with an embodiment of the invention.

FIG. 7 illustrates a process for establishing serial data link 140 in accordance with an embodiment of the invention. Although the process of FIG. 7 will be described with reference to serial interface 125, it will be appreciated that the various operations of FIG. 7 may be similarly performed by serial interface 115. In one embodiment, the process of FIG. 7 may be performed by microcontroller 240 when, for example, PLD 120 is powered up.

Turning now to the particulars of FIG. 7, in step 702, microcontroller 240 sets pre-emphasis and equalization settings of transmit port 125A and receive port 125B, respectively, to initial values. For example, in one embodiment, microcontroller 240 sets pre-emphasis and equalization settings of transmit port 125A and receive port 125B to initial values of "0%" and "short," respectively. At this time, it is assumed that serial interfaces 115 and 125 are not synchronized with each other. Accordingly, in step 702, transmit block 210 serial interface 125 transmits COMMA and RESYNC characters identified in Table 7.

Figure 8:
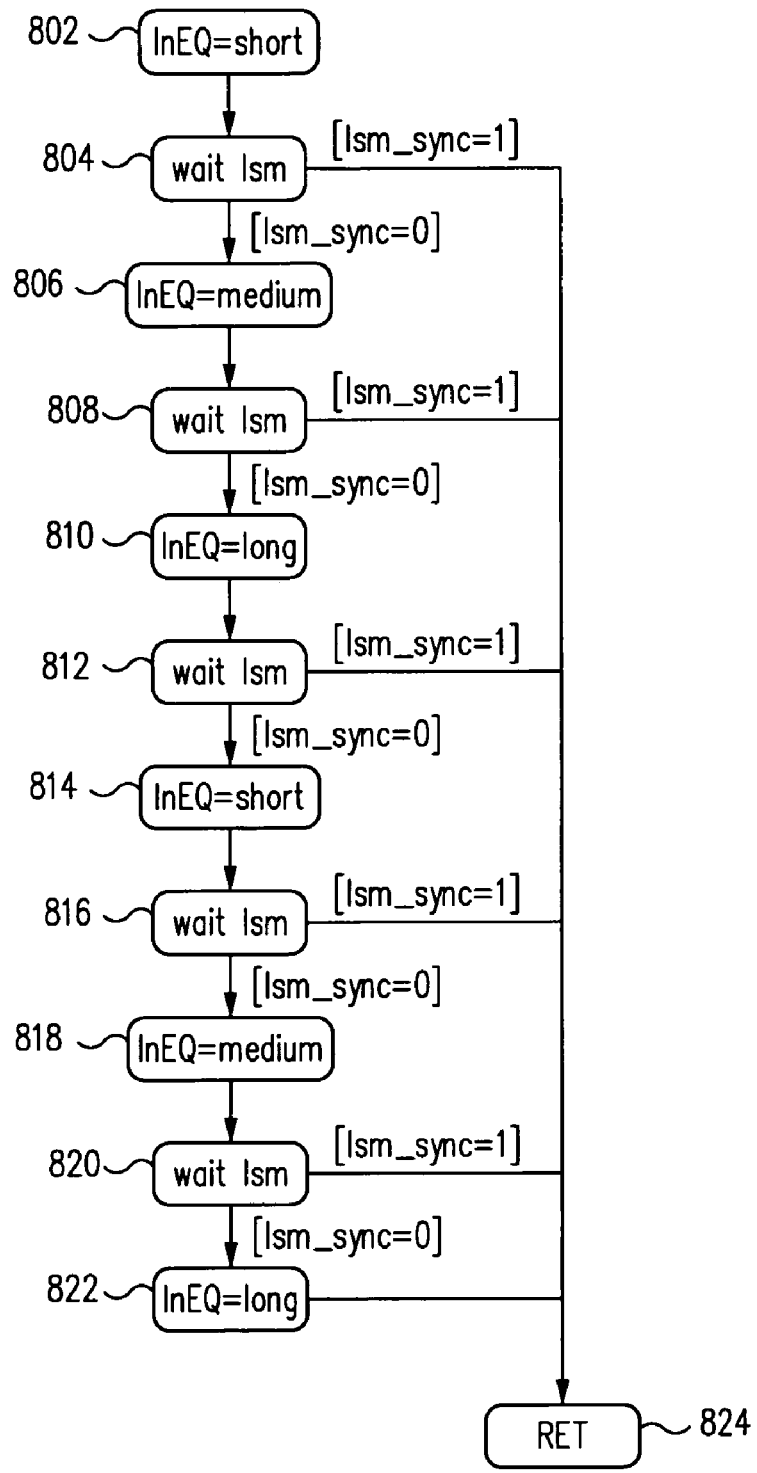
FIG. 8 illustrates a process for adjusting equalization settings in accordance with an embodiment of the invention.

In step 704, microcontroller 240 adjusts equalization settings associated with receive port 125B as set forth in the process of FIG. 8 further described herein. In step 706, microcontroller 240 determines whether bit 7 of user configuration register 230 has been set during the process of FIG. 8. If bit 7 has been set, then the process continues to step 728. Otherwise, the process continues to step 708.

In step 708, microcontroller 240 adjusts pre-emphasis settings of transmit port 125A to a new value (e.g., 16%). In step 710, microcontroller 240 adjusts equalization settings associated with receive port 125B as previously described. If bit 7 has been set (step 712), then the process continues to step 732. Otherwise, the process continues to step 714.

Steps 714-718 and 720-724 may be performed in a similar fashion to steps 708-712 described above. In this regard, microcontroller 240 will continue to adjust equalization settings associated with receive port 125B and also adjust pre-emphasis settings associated with transmit port 125A (e.g., to settings of 33% and 48%) until bit 7 has been set as determined in step 718 or step 724. If bit 7 has not been set after all pre-emphasis settings have been exhausted (step 724), then the process of FIG. 7 returns to step 702. As shown in FIG. 7, if bit 7 has been set in step 706, 712, 718, or 724, then the process of FIG. 7 continues to step 728, 732, 736, or 740, respectively.

In step 728, serial interface 125 determines whether COMMA and IDLE characters are received at receive port 125B to indicate that data is being successfully received by serial interface 115 from serial interface 125. If such characters are received at receive port 125B, then the process of FIG. 7 continues to step 742. Otherwise, the process continues to step 730.

In step 730, microcontroller 240 adjusts pre-emphasis settings of transmit port 125A to a new value as previously described in step 708. In step 732, serial interface 125 determines whether COMMA and IDLE characters are received at receive port 125B as previously described in step 728. If such characters are received at receive port 125B, then the process of FIG. 7 continues to step 7342 Otherwise, the process continues to step 734.

Steps 734-736 and 738-740 may be performed in a similar fashion to steps 730-732 described above. In this regard, microcontroller 240 will continue to adjust pre-emphasis settings associated with transmit port 125A (e.g., to settings of 33% and 48%) until COMMA and IDLE characters are received at receive port 125B (at which time the process continues to step 742), or until all pre-emphasis settings have been exhausted (step 740). If all pre-emphasis settings have been exhausted (step 740), then the process of FIG. 7 continues to step 726 where pre-emphasis settings associated with transmit port 125A are reset (e.g., to 0%).

In step 742, serial interface 125 continues to send COMMA and IDLE characters to indicate that data is being successfully received by serial interface 125 from serial interface 115. Also in step 742, serial interface 115 continues to send COMMA and IDLE characters to indicate that data is being successfully received by serial interface 115 from serial interface 125. As a result, when the process of FIG. 7 reaches step 742, serial data link 140 will have been successfully established between serial interfaces 115 and 125.

FIG. 8 illustrates a process for adjusting equalization settings associated with transmit port 125A of serial interface 125 in accordance with an embodiment of the invention. In one embodiment, the process of FIG. 8 may be performed during steps 704, 710, 716, and 722 of FIG. 7. Although the process of FIG. 8 will be described with reference to serial interface 125, it will be appreciated that the various operations of FIG. 8 may be similarly performed by serial interface 115.

In step 802, microcontroller 240 sets equalization settings of receive port 125B to an initial value of "short." In step 804, microcontroller 240 determines whether bit 7 of user configuration register 230 has been set in response to LSM 262 recognizing characters sent by serial interface 115. If bit 7 has been set, then the process continues to step 824 where the process of FIG. 8 ends and microcontroller 240 continues performing the process of FIG. 7. Otherwise, the process of FIG. 8 continues to step 806. In step 806, microcontroller 240 sets equalization settings of receive port 125B to a new value of "medium."

Steps 808-810, 812-814, 816-818, and 820-822 may be performed in a similar fashion to steps 804-806 described above. In this regard, microcontroller 240 will continue to adjust equalization settings associated with receive port 125B (e.g., to settings of short, medium, and long) until either bit 7 of user configuration register 230 has been set, or all equalization settings have been attempted twice. In either case, the process of FIG. 8 ends (step 824) and microcontroller 240 continues performing the process of FIG. 7.

Embodiments described above illustrate but do not limit the invention. It should also be understood that numerous modifications and variations are possible in accordance with the principles of the present invention. Accordingly, the scope of the invention is defined only by the following claims.

We claim:

1. A programmable logic device (PLD) comprising:
   a plurality of programmable logic blocks adapted to be programmed to configure the PLD for its intended function; and
   a serial interface comprising:
      a transmit port for coupling the PLD to an external device through a serial data link;
      a first transmit register adapted to receive normal priority data from the programmable logic blocks as transmit data to be provided over the serial data link through the transmit port;
      a second transmit register adapted to receive high priority data from the programmable logic blocks as transmit data to be provided over the serial data link through the transmit port; and
      transmit logic coupled to the first and second transmit registers and adapted to prepare a serial signal comprising the transmit data for transmission from the transmit port over the serial data link, wherein the transmit logic is further adapted to insert the high priority data into the serial signal prior to the normal priority data.

2. The PLD of claim 1, wherein the transmit logic comprises:
   a physical control sublayer (PCS) block adapted to encode the transmit data as an 8b10b encoded data packet; and
   a serial-deserializer (serdes) block adapted to convert the 8b10b encoded data packet into a serial data packet for transmission over the transmit port as part of the serial signal.

3. The PLD of claim 1, wherein the serial signal is a first serial signal, the data signal is a first data signal, and the serial interface comprises:
   a receive port;
   receive logic adapted to receive a second serial signal over the serial data link through the receive port, wherein the second serial signal comprises receive data to be provided to the programmable logic blocks, wherein the receive logic is adapted to extract the receive data from the second serial signal; and a receive register adapted to receive the receive data from the receive logic and provide the receive data to the programmable logic blocks as a second data signal comprising the receive data.

4. The PLD of claim 3, wherein the receive logic comprises:

a serial-deserializer (serdes) block adapted to convert a serial data packet comprising the receive data into an 8b10b encoded data packet, wherein the serial data packet is provided by the second serial signal; and a physical control sublayer (PCS) block adapted to decode the 8b10b encoded data packet to provide the receive data.

5. The PLD of claim 1, wherein the transmit data comprises a data packet provided by the programmable logic blocks.

6. The PLD of claim 1, wherein the transmit data comprises a data stream provided by the programmable logic blocks.

7. The PLD of claim 1, wherein the PLD is a first PLD and the external device is a second PLD.

8. The PLD of claim 1, wherein the serial interface includes a microcontroller adapted to adjust pre-emphasis settings associated with the transmit port to tune the serial data link.

9. A method performed by a serial interface of a programmable logic device (PLD) to provide a serial data link between the PLD and an external device, the method comprising:

adjusting pre-emphasis settings associated with a transmit port of the PLD to tune the serial data link;

receiving a first data signal from programmable logic blocks of the PLD, wherein the first data signal comprises normal priority data to be provided over the serial data link through the transmit port;

receiving a second data signal from the programmable logic blocks, wherein the second data signal comprises high priority data to be provided over the serial data link through the transmit port;

preparing a serial signal for transmission from the transmit port over the serial data link; and inserting as transmit data into the serial signal the high priority data prior to the normal priority data.

10. The method of claim 9, wherein the preparing comprises:

encoding the transmit data as an 8b10b encoded data packet; and converting the 8b10b encoded data packet into a serial data packet for transmission over the transmit port as part of the serial signal.

11. The method of claim 9, wherein the serial signal is a first serial signal, the data signal is a first data signal, and the method comprises:

adjusting equalization settings associated with a receive port of the PLD to further tune the serial data link;

receiving a second serial signal over the serial data link through the receive port, wherein the second serial signal comprises receive data to be provided to the programmable logic blocks;

extracting the receive data from the second serial signal; and providing the receive data to the programmable logic blocks as a second data signal comprising the receive data.

12. The method of claim 11, wherein the extracting comprises:

converting a serial data packet comprising the receive data into an 8b10b encoded data packet, wherein the serial data packet is provided by the second serial signal; and decoding the second 8b10b encoded data packet to provide the receive data.

13. The method of claim 11, wherein the receive data is normal priority data, the second serial signal comprises high priority data to be provided to the programmable logic blocks, and the method comprises:

extracting the high priority data from the second serial signal; and providing the high priority data to the programmable logic blocks as a third data signal comprising the high priority data.

14. The method of claim 9, wherein the transmit data comprises a data packet provided by the programmable logic blocks.

15. The method of claim 9, wherein the transmit data comprises a data stream provided by the programmable logic blocks.

16. The method of claim 9, wherein the PLD is a first PLD and the external device is a second PLD.

17. A programmable logic device (PLD) comprising:

a plurality of programmable logic blocks adapted to be programmed to configure the PLD for its intended function; and a serial interface comprising:

a receive port for coupling the PLD to an external device through a serial data link;

receive logic adapted to receive a serial signal over the serial data link through the receive port, wherein the serial signal comprises receive data to be provided to the programmable logic blocks, wherein the receive logic is adapted to extract high priority data and normal priority data from the serial signal;

a first receive register adapted to receive the normal priority data from the receive logic and provide the normal priority data as receive data to the programmable logic blocks; and a second receive register adapted to receive the high priority data from the receive logic and provide the high priority data as receive data to the programmable logic blocks.

18. The PLD of claim 17, wherein the serial signal is a first serial signal, and the serial interface comprises;

a transmit port;

transmit logic adapted to prepare a second serial signal for transmission from the transmit port over the serial data link, wherein the second serial signal comprises transmit data; and a transmit register adapted to receive transmit data from the programmable logic blocks and provide the transmit data to the transmit logic.

* * * * *